United States Patent [19]
Culican et al.

[11] Patent Number: 4,613,958
[45] Date of Patent: Sep. 23, 1986

[54] GATE ARRAY CHIP

[75] Inventors: Edward F. Culican, Hyde Park; Matthew C. Graf, Highland, both of N.Y.; Leonard C. Ritchie, Fontainebleau, France

[73] Assignee: International Business Machines Corporation, Armonk, N.Y.

[21] Appl. No.: 625,426

[22] Filed: Jun. 28, 1984

[51] Int. Cl.$^4$ .............................................. G11C 7/00
[52] U.S. Cl. .................... 365/189; 365/155
[58] Field of Search ................ 365/154, 155, 179, 189

[56] References Cited

U.S. PATENT DOCUMENTS

| | | | |
|---|---|---|---|
| 3,427,598 | 2/1969 | Kubinec | 365/155 |
| 3,531,778 | 9/1970 | Gardner et al. | 365/155 |
| 3,543,296 | 11/1970 | Gardner et al. | 365/49 |
| 3,617,772 | 11/1971 | Tertel et al. | 307/247 |
| 3,618,052 | 11/1971 | Kwei et al. | 365/95 |
| 3,634,833 | 1/1972 | Dunn et al. | 365/49 |
| 3,740,730 | 6/1973 | Ho et al. | 365/230 |
| 4,007,451 | 2/1977 | Heuber et al. | 365/154 |
| 4,035,784 | 7/1977 | Brown | 365/155 |
| 4,057,789 | 11/1977 | Spadavecchia | 365/189 |

OTHER PUBLICATIONS

"Load Impedance for Transistor Circuit" by H. D. Varadarajan, IBM Technical Disclosure Bulletin, vol. 12, No. 9, Feb. 1970, p. 1516.
"Programmable Logic Chip" by M. S. Axelrod and S. Singh, IBM Technical Disclosure Bulletin, vol. 14, No. 4, Sep. 1971, p. 1056.
"Fast-Write Search Cam Cell" by H. J. Kelly, IBM Technical Disclosure Bulletin, vol. 17, No. 3, Aug. 1974, p. 882.
"Decoder for Ground-Up Array with STL-Compatible Output" by H. D. Varadarajan, IBM Technical Disclosure Bulletin, vol. 20, No. 4, Sep. 1977, p. 1451.
"Implementing Array and Logic Functions On a Single Chip" by J. N. Pomeranz, R. Nijhuis, R. Ehrlickman, E. Colao & R. Dennison, IBM Technical Disclosure Bulletin, vol. 20, No. 10, Mar. 1978, p. 3921.
"Memory With Double Word Readout" by Y. M. Ting, H. D. Varadarajan, IBM Technical Disclosure Bulletin, vol. 21, No. 7, Dec. 1978, p. 2831.
"STL Masterslice Random-Access Memory" by A. H. Dansky, R. T. Dennison & H. D. Varadarajan, IBM Technical Disclosure Bulletin, vol. 21, No. 7, Dec. 1978, p. 2833.
"Integrated Static SCR Memory Cell" by R. T. Farley & H. D. Varadarajan, IBM Technical Disclosure Bulletin, vol. 22, No. 1, Jun. 1979, p. 135.
"Low-Power Bipolar Random-Access Memory Array" by H. D. Varadarajan, IBM Technical Disclosure Bulletin, vol. 22, No. 8B, Jan. 1980, p. 3711.
"I$^2$L/MLT Storage Cell Layout", by H. H. Berger, K. Heuber, E. Klink & S. K. Wiedmann, IBM Technical Disclosure Bulletin, vol. 22, No. 10, Mar. 1980, p. 4604.
"Lay-Out of an Emitter-Coupled Cell with PNP Loads", by G. Boudon, B. Denis & P. Mollier, IBM Technical Disclosure Bulletin, vol. 23, No. 4, Sep. 1980, p. 1473.
"Efficient Memory Cell Useful for DC Testing" by E. F. Culican & H. D. Varadarajan, IBM Technical Disclosure Bulletin, vol. 23, No. 6, Nov. 1980, p. 2309.
"Bipolar Memory Cell with Polysilicon-Metal Cross-Coupling" by D. D. Howard & S. K. Weidmann, IBM Technical Disclosure Bulletin, vol. 23, No. 7A, Dec. 1980, p. 2727.
"Redundancy Schmeme for High-Speed Random-Access Memories" by S. D. Malaviya, IBM Technical Disclosure Bulletin, vol. 23, No. 7B, Dec. 1980, p. 3248.
"MLT/I$^2$L Storage Cell" by A. Schmitt, IBM Technical Disclosure Bulletin, vol. 23, No. 8, Jan. 1981, p. 3745.

(List continued on next page.)

Primary Examiner—Joseph A. Popek
Attorney, Agent, or Firm—Wesley DeBruin

[57] ABSTRACT

Disclosed is a memory cell circuit for a gate array. The memory cell circuit is D.C. testable and has particular utility when employed in an integrated circuit containing "a mix of logic and array".

Also disclosed is a memory array particularly adapted for use in an integrated circuit containing TTL logic circuits.

21 Claims, 7 Drawing Figures

OTHER PUBLICATIONS

"Harper PNP Cell Layout with Improved PNP Characteristics" by R. Cullet, B. Denis & D. Omet, IBM Technical Disclosure Bulletin, vol. 26, No. 2, Jul. 1983, p. 658.

"Memory Cell with Minimized Negative Resistance Effects" by M. J. Hargrove & C. J. Masenas, IBM Technical Disclosure Bulletin, vol. 26, No. 6, Nov. 1983, p. 2692.

"SCR Cross-Coupled Memory Cell" by M. D. Hulvey, I. W. Kim & T. A. Selfridge, IBM Technical Disclosure Bulletin, vol. 26, No. 7A, Dec. 1983, p. 3119.

"Low Leakage Complementary Transistor Switch Cell" by B. W. Martin, Jr., G. A. Ritter, C. G. Rivadeniera & S. C. Sullivan, IBM Technical Disclosure Bulletin, vol. 26, No. 7A, Dec. 1983, p. 3229.

"High Performance Integrated Array Cell" by A. E. Barish and R. L. Ehrlickmann, IBM Technical Disclosure Bulletin, vol. 26, No. 7A, Dec. 1983, p. 3240.

"Multi-Port RAM Cell Structure" by M. N. Shen, IBM Technical Disclosure Bulletin, vol. 26, No. 7B, Dec. 1983, p. 3588.

FIG. 1

T²L NAND GATE

FIG. 2 PRIOR ART

SENSE AMP

REPRESENTATIVE CHIP FUNCTION

FIG. 6

GATE ARRAY CHIP CONTAINING
p X r IDENTICAL CELLS

FIG. 7

GATE ARRAY CHIP

FIELD OF INVENTION

This invention relates generally to integrated circuits. More particularly this invention relates to an improved gate array chip for fabricating logic and array(s) on the same chip.

BACKGROUND OF THE INVENTION AND PRIOR ART

In VLSI it is desirable to incorporate logic and a memory array (or arrays) on the same chip. To do this efficiently over a wide range of application, flexibility of organization is required. The disclosed invention facilitates the mixing of logic and array(s) on the same chip. The memory cell is D.C. testable.

BACKGROUND ART

The following patents and publications are directed to integrated circuit Read/Write memories and/or memory cells for use therein. It is to be appreciated, that the following art is not submitted to be the only, the best, or the most pertinent art.

PATENTS

U.S. Pat. No. 3,427,598 entitled "Emitter Gated Memory Cell" granted Feb. 11, 1969 to J. J. Kubinec.

U.S. Pat. No. 3,531,778 entitled Data Storage Devices Using Cross-Coupled Plural Emitter Transistors" granted Sept. 29, 1970 to P. A. E. Gardner et al.

U.S. Pat. No. 3,543,296 entitled "Data Storage Cell For Multi-Stable Associative Memory System" granted Nov. 24, 1970 to P. A. E. Gardner et al.

U.S. Pat. No. 3,617,772 entitled "Sense Amplifier/Bit Driver For a Memory Cell" granted Nov. 2, 1971 to K. G. Tertel.

U.S. Pat. No. 3,618,052 entitled "Bistable Memory With Predetermined Turn-On State" granted Nov. 2, 1971 to T. Kwei et al.

U.S. Pat. No. 3,634,833 entitled "Associative Memory Circuit" granted Jan. 11, 1972 to R. S. Dunn et al.

U.S. Pat. No. 3,740,730 entitled "Latchable Decoder Driver and Memory Array" granted June 19, 1973 to I. T. Ho et al.

U.S. Pat. No. 4,007,451 entitled "Method And Circuit Arrangement For Operating a Highly Integrated Monolithic Information Store" granted Feb. 8, 1977 to K. Heuber et al.

U.S. Pat. No. 4,035,784 entitled "Asymmetrical Memory Cell Arrangement" granted July 12, 1977 to G. W. Brown.

U.S. Pat. No. 4,057,789 entitled "Reference Voltage Source For Memory Cells" granted Nov. 8, 1977 to R. I. Spadavecchia et al.

PUBLICATIONS

[IBM Technical Disclosure Bulletin (IBM TDB)]

"Load Impedance For Transistor Circuit" by H. D. Varadarajan, IBM TDB Vol. 12, No. 9, January 1970, page 1516.

"Programmable Logic Chip" by M. S. Axelrod et al, IBM TDB Vol. 14 No. 4, September 1971, pages 1056-7.

"Fast-Write Search Cam Cell" by H. J. Kelly, IBM TDB Vol. 17 No. 3, August 1974, page 882.

"Decoder For Ground-Up Array With STL-Compatible Output" by H. D. Varadarajan, IBM TDB Vol. 20 No. 4, September 1977, pages 1451-2.

"Implementing Array And Logic Functions on a Single Chip" by J. N. Pomeranz et al, IBM TDB Vol. 20 No. 10, March 1978, pages 3921-2.

"Memory With Double Word Readout" by Y. M. Ting et al, IBM TDB Vol. 21 No. 7, December 1978, pages 2831-2.

"STL Masterslice Random-Access Memory" by A. H. Dansky et al, IBM TDB Vol. 21 No. 7, December 1978, pages 2833-8.

"Integrated Static SCR Memory Cell" by R. T. Farley et al, IBM TDB Vol. 22 No. 1, June 1979, pages 135-6.

"Low-Power Bipolar Random-Access Memory Array" by H. D. Varadarajan, IBM TDB Vol. 22 No. 8B, January 1980, pages 3711-13.

"$I^2L$/MTL Storage Cell Layout" by H. H. Berger et al, IBM TDB Vol. 22 No. 10, March 1980, pages 4604-05.

"Lay-Out Of An Emitter-Coupled Cell With PNP Loads" by G. Boudon et al, IBM TDB Vol. 23 No. 4, September 1980, pages 1473-4.

"Efficient Memory Cell Useful For DC Testing" by E. F. Culican et al, IBM TDB Vol. 23 No. 6, November 1980, pages 2309-10.

"Bipolar Memory Cell With Polysilicon-Metal Cross-Coupling" by D. D. Howard et al, IBM TDB Vol. 23 No. 7A, December 1980, pages 2727-29.

"Redundancy Scheme For High-Speed Random-Access Memories" by S. D. Malaviya, IBM TDB Vol. 23 No. 7B, December 1980, pages 3248-50.

"MTL/$I^2L$ Storage Cell" by A. Schmitt, IBM TDB Vol. 23 No. 8, January 1981, page 3745.

"Harper PNP Cell Layout With Improved PNP Characteristics" by R. Cullet et al, IBM TDB Vol. 26 No. 2, July 1983, pages 658-9.

"Memory Cell With Minimized Negative Resistance Effects" by M. J. Hargrove et al, IBM TDB Vol. 26 No. 6, November 1983, pages 2692-3.

"SCR Cross-Coupled Memory Cell" by M. D. Hulvey et al, IBM TDB Vol. 26 No. 7A, December 1983, pages 3119-21.

"Low Leakage Complementary Transistor Switch Cell" by B. W. Martin Jr. et al, IBM TDB Vol. 26 No. 7A, December 1983, pages 3229-30.

"High Performance Integrated Array Cell" by A. E. Barish et al, IBM TDB Vol. 26 No. 7A, December 1983, pages 3240-1.

"Multi-Port RAM Cell Structure" by M. N. Shen, IBM TDB Vol. 26 No. 7B, December 1983, pages 3588-9.

U.S. PATENT APPLICATION

"Memory Array with Switchable Upper and Lower Word Lines" Ser. No. 336,004, filed Dec. 30, 1981 by R. W. Knepper, and of common assignee with the subject application, now U.S. Pat. No. 4,460,984. The aforeidentified Knepper patent application is incorporated herein by reference thereto to the same and full extent as though it was expressly set forth herein.

SUMMARY OF THE INVENTION

In the mixing of logic and array on the same chip several approaches are available. The first approach is to replace a portion of the logic silicon with array silicon. It has the characteristic of requiring a standard A.C. testing. A second approach is to personalize the logic devices to form a standard array circuit. This would require unembedding the array (making it available at I/O's) and A.C. testing it (thus increasing cost). The invention discloses and utilizes a basic memory cell circuit designed for an array to mix with logic. A primary advantage is that it is DC testable. Therefor it can be treated as a standard logic macro. The gate array user may design any size and organization that is needed. It also can allow for more than one array on chip. The design is set up to use the opposite philosophy than normal RAM designs, instead of trying to minimize the signal swing, they have been increased to look like normal internal circuit levels. Examining FIG. 1, during the write mode the word write line is high turning T1C Off. The combination of T1A, T2, R1, R2 and R3 are utilized to set new data into the latch or memory cell. In the hold state the word write line is Down and T1A is turned Off. T1C, T2 form an internal circuit and data is maintained in the latch. D.C. testability is demonstrated by the fact that these operating regions are identical to the conventional logic circuits. Therefore they have the same propensity for noise rejection. A further consideration is the transition from "write" to "hold". As the word write line is dropped T1A can turn off faster than T1C turns on (especially true with slow rise time card testers). This could cause a problem if negative data is being stored. T1B solves this problem by holding the collector of T1 down until T1C is turned on. Thus of course, that Data has to remain valid until the word write line has been removed.

Therefore a primary object of the invention is to provide an integrated circuit chip wherein logic and memory array(s) are efficiently and effectively integrated for functional use and as well as initial testing.

A primary object of the invention is to provide an integrated circuit chip wherein logic and memory contained thereon may be readily D.C. tested.

A primary object of the invention is to provide an integrated circuit chip containing p thousand (where p is a positive integer) identical cells, each cell containing components such as transistors, resistor diodes, etc. The metallization of only a single cell is required to provide a mutli-input TTL logic circuit or a single binary bit memory cell for use in a chip containing a memory array and logic circuitry or the like.

BRIEF DESCRIPTION OF THE DRAWING

The foregoing and other objects, features and advantages of the invention will be more apparent from the following more particular description of the preferred embodiment of the invention, as illustrated in the accompanying drawings.

Note: T3 of FIG. 1 and T4 of FIG. 3 corresponds to the T1 and T2, respectively, of the TTL circuit of FIG. 2.

In VLSI it is desirable to incorporate logic and memory on the same chip. To do this efficiently over a wide range of applications and organizations a Gate Array environment is required. The disclosed memory facilitates the mixing of logic and memory on the same chip. The subject of testing is addressed in designing a memory cell that is Stuck Fault Testable.

In the mixing of logic and memory on the same chip, several approaches were available. The first approach is to replace a portion of the Gate Array with a Custom Designed RAM—a hybrid approach. Such designs traditionally tend to utilize the process to its fullest. In addition, the circuit designs tend to have small signal swings to increase the RAM's access time, resulting in a design with lower noise margin than its logic counterpart. The net result is a RAM that is more sensitive to process variations than the logic. This sensitivity manifests itself in the defective product failing under rather extraordinary circumstances. One such failure mode is called a disturb. A disturb is an unintentioned change of state of the memory. This failure can occur under a variety of differing circumstances—varying the RAM patterns or modifying the timings applied to the memory. Such tests are usually voluminous in nature and applied to the ARRAY at or near the cycle time of the product.

Figure 1:
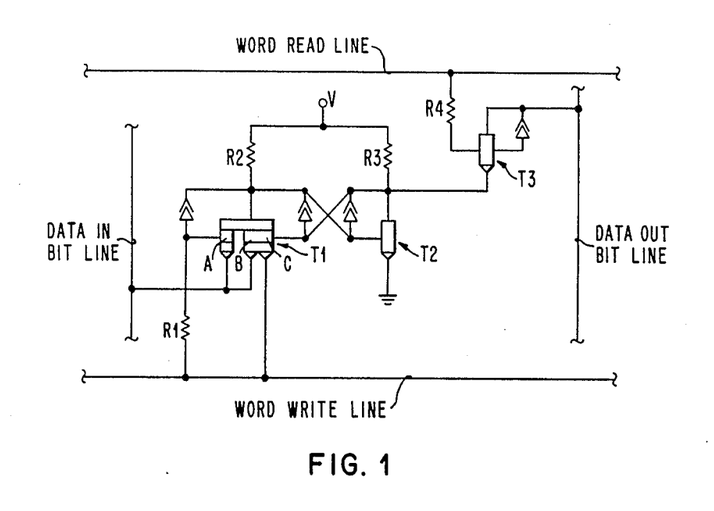
FIG. 1 is a circuit diagram of a memory cell of a word-organized store or memory array in accordance with the invention.

A second approach, personalizing the logic devices to form a standard array design, falls into a similar category as the first approach since the basic design has similar noise margins and process sensitivities. FIG. 1 illustrates a basic RAM cell that can be used as a standard logic macro, defined through personalization of a Gate Array. The cell is fed by standard TTL gates, and its fanout is equivalent to that of a standard design—1 to 8 approximately. This cell differs from other cell designs in its inherent stability, its freedom from hazards, and its comparable noise margin to that of logic. The net result is that the basic RAM derived from this cell and its Sense Amplifier rids the RAM of the disturbs that plagued previous RAM designs without sacrificing inordinate amounts in density, thus allowing the manufacturer to test this RAM in a much simpler manner than was previously possible.

Examining FIG. 1, during the write operation, the Word Write Line is high turning T1C off. Under this condition of the Word Write Line, T1A is either on or off depending on the state of the Data-In Bit Line. If T1A is on the collector of T1 is pulled low, otherwise R2 will pull the collector high. The T2 device is used to bias the base of T1C and T1B. Let us assume the Data-In Bit Line is low. Under this condition, T2 is off and therefore the base of T1C and T1B is high. As the Word Write Line falls, T1A turns off before T1C turns on to hold the base of T2 low. This race condition is termed a hazard. T1B is used to hold the base of T2 low during the transition of the Word Write Line to free the design from this hazard—thus a hazard-free latch design. This aspect of the design is important if our objective is to test the RAM as the industry tests logic. Under most applications, especially with Bipolar product, logic is tested in a slow speed manner, that is, slow in comparison to the switching speeds of the logic. Under such an environment, a hazard-free design is very desirable since transitions generated by the tester may be quite slow. To finish, with the Word Read Line high, the state of the memory cell at the collector of T2 is fed out on the Data-Out Bit Line.

Figure 2:
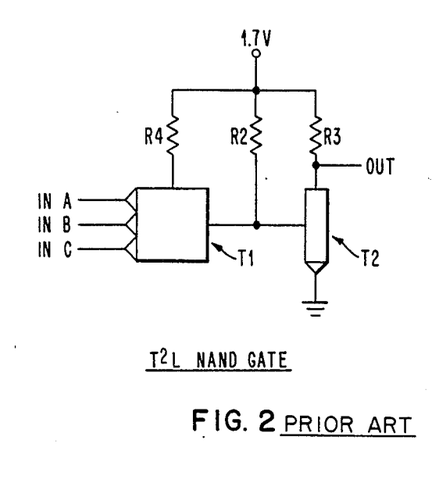
FIG. 2 is a circuit diagram of a known TTL logic circuit generally of the type which may be fabricated on an array and/or logic chip in accordance with the invention.
Figure 3:
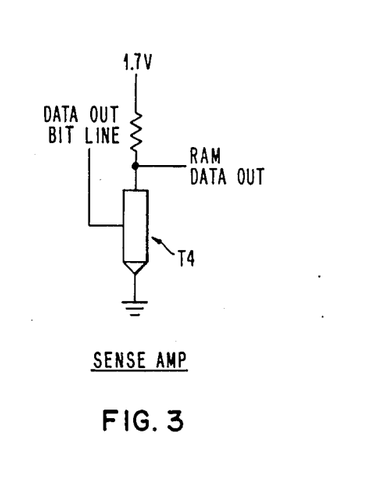
FIG. 3 is a circuit diagram of a sense amplifier which may be employed with the memory array in accordance with the invention.
Figure 4:
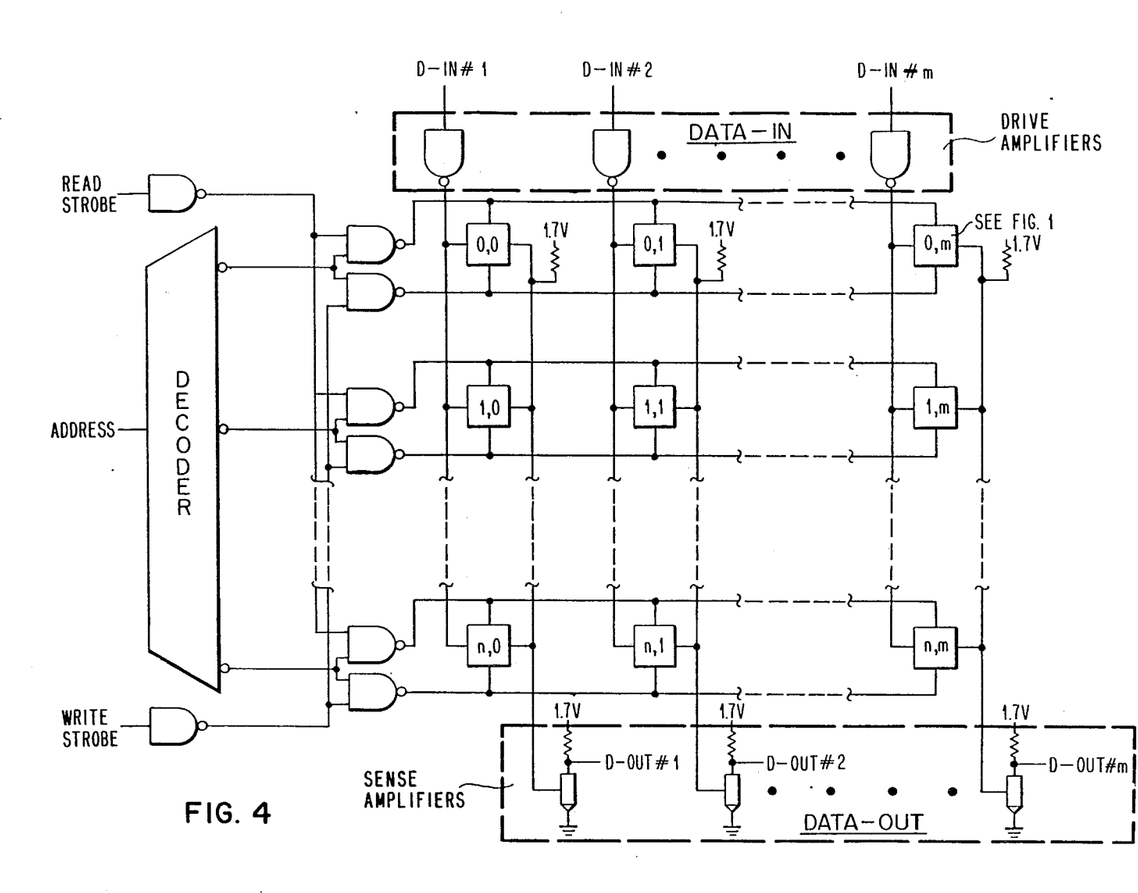
FIG. 4 is a circuit-block diagram of an embodiment of a memory array in accordance with the invention.

The Sense Amplifier for this design is shown in FIG. 3. FIG. 4 depicts how the RAM cell and its Sense Amplifier are connected in order to configure a RAM. Referring to FIG. 4, T3 of the basic cell, and T4 within the Sense Amplifier are configured in a manner similar to the transistor configuration of a TTL gate in FIG. 2. The Word Read Line, the Data-In Bit Line, and the Word Write Line are fed by regular TTL logic gates, an example of which is shown in FIG. 2. From the basic memory cell's perspective, a read and write operation are logically divorced from one another. It is the logical configuration which feeds the memory cells which determine the relationship between reading and writing. In the design example shown in FIG. 4, a selected Word within the RAM may be both Written and Read simultaneously if both the Read Strobe and the Write Strobe are both active. The RAM configuration in FIG. 5, using the same cell, has the option of two different addresses to the RAM selecting a different word for reading and writing.

The RAM of FIG. 4 is composed of a decoder, a matrix of the memory cells, and the sense and drive amplifiers. The decoder selects a row or word of cells according to the address value. The cells within the word are selected to read, or write, or to both read and write simultaneously. This is accomplished by placing the proper polarity on the Read and Write strobe inputs. The Word Write line of the basic cell is controlled by the output of the decoder and the write strobe input. The word must be addressed and the Write strobe active in order for information on the drive amplifiers to be accepted or written into the word. The word read line of the basic cell is controlled by the decoder and the read strobe. In a similar manner the word must be selected by the address with the read strobe active in order for valid word data to appear on the output of the sense amplifiers.

Figure 5:
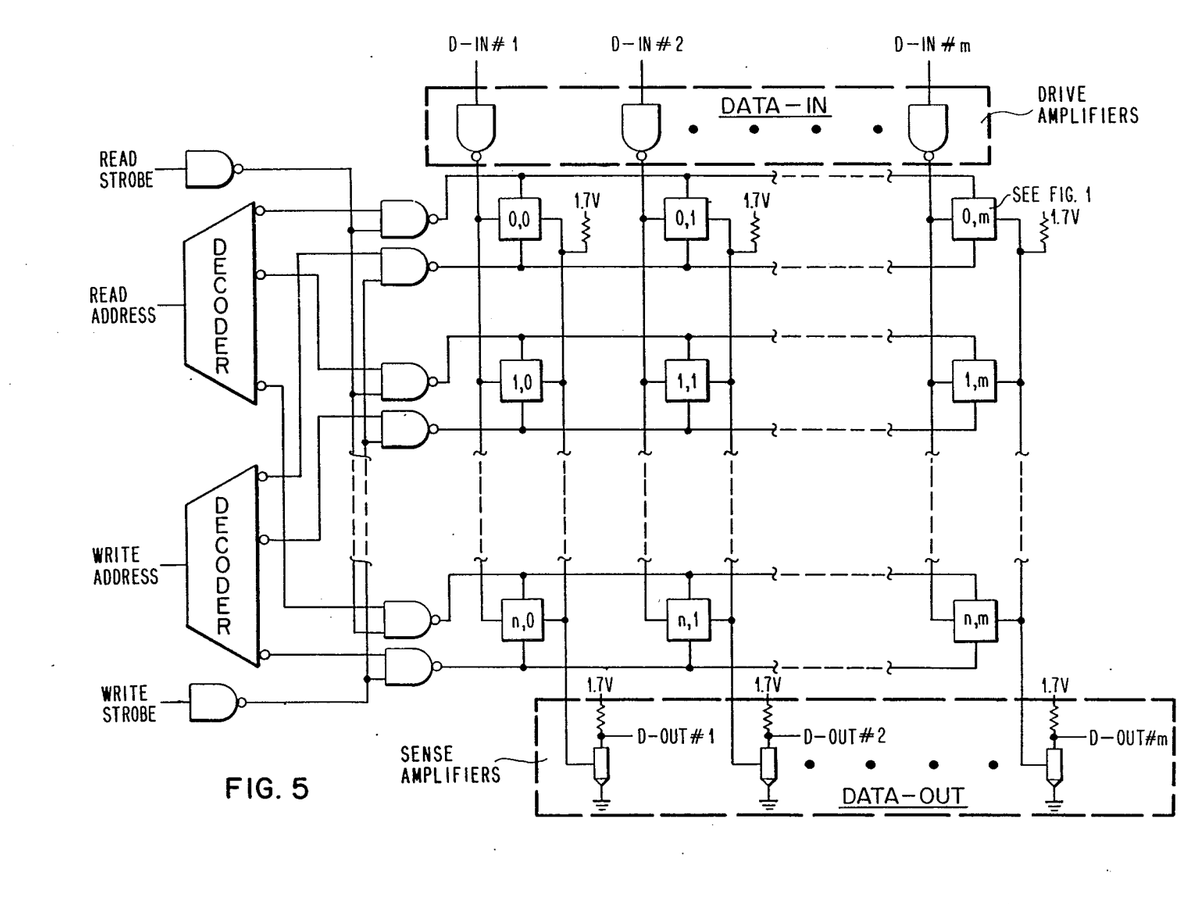
FIG. 5 is a circuit-block diagram of an embodiment of a memory array in accordance with the invention.

In a more general case, FIG. 5 represents a two port RAM. Here two decoders are realized—one for reading and the other for writing. The RAM operates similar to the implementation in FIG. 4 except that in FIG. 5 the word selected by the Read Address is Read and the word selected by the Write Address is written. If the Read Address and Write Address of FIG. 5 were always equal, then FIG. 5 and FIG. 4 would be logically identical.

Figure 6:
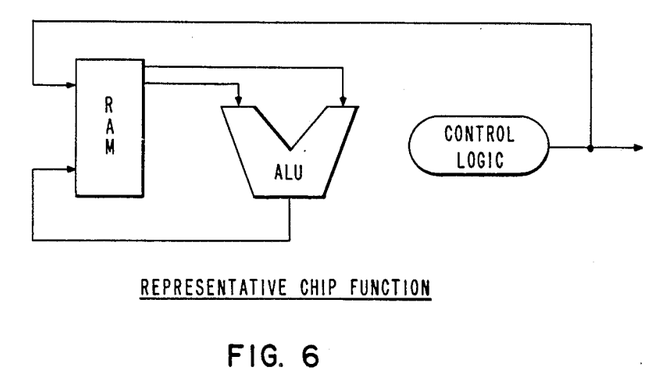
FIG. 6 is a very generalized showing of a representative function which, as known to the art, may be contained on an integrated circuit.

FIG. 6 is a schematic block diagram of a function which, as known to the prior art, may be implemented on a single semiconductor chip. The block diagram includes the interconnection of a random access memory (RAM), an arithmetic logical unit (ALU) and control logic.

Figure 7:
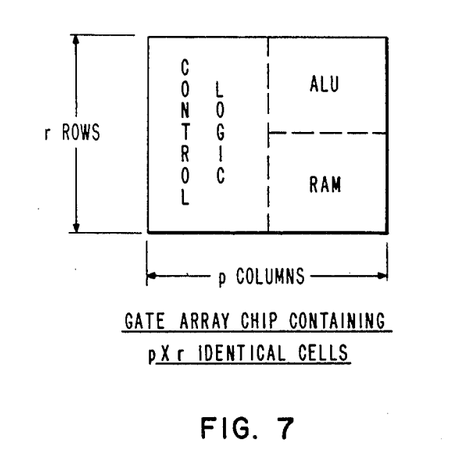
FIG. 7 is a very generalized showing of a gate array chip, in accordance with the invention and containing Pxr identical cells. The cells as depicted may be personalized, to provide the representative chip function of FIG. 6.

In FIG. 7 a gate array chip having p×v identical cells is depicted. The cells may, for example, be arranged in v rows and p columns. The gate array chip may be personalized (metalization) to provide the representative chip function illustrated in the schematic block diagram of FIG. 6.

While the invention has been particularly shown and described with reference to one if its preferred embodiments, it will be understood by those skilled in the art to which the work is directed that various changes in form and detail may be made therein without departing from either the spirit or scope of the invention.

What is claimed is:

1. In an integrated circuit chip containing interconnected logic circuit means and memory array circuit means, said memory array circuit means including:

word read circuit means having at least one word read line;

word write circuit means having at least one word write line;

data In circuit means having at least one data In bit line;

data Out circuit means having at least one data Out bit line; and at least one memory cell circuit, said memory cell circuit comprising, first, second, third, fourth and fifth transistors, each of said transistors having an emitter, base and collector, said emitters of said first and second transistors being connected in common to said data In bit line, said emitter of said third transistor being connected to said word write line, said collector of said fifth transistor being connected to said data Out bit line and said emitter of said fourth transistor being connected to a second source of potential, a first resistor connected between said base of said first transistor and said word write line, a second resistor connected between a common connection of said collector of said first transistor, said collector of said second transistor, said collector of said third transistor, and said base of said fourth transistor and a first source of potential, a third resistor connected between a common connection of said base of said second transistor, said base of said third transistor, said collector of said fourth transistor and said emitter of said fifth transistor and said first source of potential, and a fourth resistor connected between said base of said fifth transistor and said word read line.

2. In an integrated circuit chip containing interconnected logic circuit means and memory array circuit means, as received in claim 1, wherein said first, second and third transistors are provided by a single integrated circuit semiconductor transistor structure, said single integrated circuit semiconductor transistor structure having a collector region for providing in common the collectors of said first, second and third transistors, a first base region for providing the base of said first transistor, a second base region for providing in common the base of said second and third transistors, and first, second and third emitters for respectively providing said emitters of said first, second and third transistors.

3. In an integrated circuit chip containing interconnected logic circuit means and memory array circuit means, as recited in claim 2, wherein a first Schottky diode is connected across said collector-base junction of said first transistor, a second Schottky diode is connected across said common collector-base junction of said second and third transistors, a third Schottky diode is connected across said collector-base junction of said fourth transistor and a fourth Schottky diode is connected across said collector-base junction of said fifth transistor.

4. In an integrated circuit chip containing interconnected logic circuit means and memory array circuit means, said memory array circuit means including:

word read circuit means having at least one word read line;

word write circuit means having at least one word write line;

data in circuit means having at least one data in bit line;

data out circuit means having at least one data out bit line; and at least one memory cell circuit, said memory cell circuit comprising, first, second, third, fourth and fifth transistors, each of said transistors having an emitter, base and collector, said emitters of said first and second transistors being connected in common to said data in bit line, said emitter of said third transistor being connected to said word write line, said collector of said fifth transistor being connected to said data out bit line and said emitter of said fourth transistor being connected to a second source of potential, a first resistor connected between said base of said first transistor and said word write line, a second resistor connected between a common connection of said collector of said first transistor, said collector of said second transistor, said collector of said third transistor and said base of said fourth transistor and a first source of potential, a third resistor connected between a common connection of said base of said second transistor, said base of said third transistor, said collector of said fourth transistor and said emitter of said fifth transistor and said first source of potential, a fourth resistor connected between said base of said said fifth transistor and said word read line, wherein said first, second and third transistors are provided by a single integrated circuit semiconductor transistor structure, said single integrated circuit semiconductor transistor structure having a collector region for providing in common the collectors of said first, second and third transistors, a first base region for providing the base of said first transistor, a second base region for providing in common the base of said second and third transistors, and first, second and third emitters for respectively providing said emitters of said first, second and third transistors, wherein a first Schottky diode is connected across said collector-base junction of said first transistor, a second Schottky diode is connected across said common collector-base junction of said second and third transistors, a third Schottky diode is connected across said collector base junction of said fourth transistor and a fourth Schottky diode is connected across said collector-base junction of said fifth transistor.

5. In an integrated circuit chip containing logical circuit means for performing at least one logical function and at least one monolithic memory for storing binary data, said logical circuit means and said at least one monolithic memory being interconnected, said memory comprising:

an array of memory cells having m columns and n rows, where m and n are positive integers and said memory array includes m×n memory cells, where each of said cells has the capacity to store one binary data bit and each of said n rows of memory cells has the capacity to store a binary word (or byte) of m binary bits;

m pairs of bit lines, each pair of bit lines comprising a data-in bit line and a data-out bit-line;

n pairs of word lines each pair of word lines comprising a word read line and a word write-line;

each of said m columns of memory cells being connected between the data-in bit line and the data-out bit line of a discrete one of said m pairs of bit lines;

each of said n rows of memory cells being connected between the word read line and the word write line of a discrete one of said n pairs of word lines;

data-in circuit means connected to said m data-in bit lines of said m pairs of bit lines;

data-out circuit means connected to said m data-out bit lines of said m pairs of bit lines; and control circuit means connected to said n pairs of word lines for reading data stored in said memory array and/or writing data into said memory array.

6. In an integrated circuit chip containing logical circuits means for performing at least one logical function and at least one monolithic memory for storing binary data, said logical circuit means and said at least one monolithic memory being interconnected, as recited in claim 5, each of said m×n memory cells comprising, first, second, third, fourth and fifth transistors, each of said transistors having an emitter, base and collector, said emitters of said first and second transistors being connected in common to said data-in bit line, said emitter of said third transistor being connected to said word write line, said collector of said fifth transistor being connected to said data-out bit line and said emitter of said fourth transistor being connected to a second source of potential, a first resistor connected between said base of said first transistor and said word write line, a second resistor connected between a common connection of said collector of said first transistor, said collector of said second transistor, said collector of said third transistor, and said base of said fourth transistor and a first source of potential, a third resistor connected between a common connection of said base of said second transistor, said base of said third transistor, said collector of said fourth transistor and said emitter of said fifth transistor and said first source of potential, and a fourth resistor connected between said base of said fifth transistor and said word read line.

7. In an integrated circuit chip containing interconnected logic circuit means and at least one monolithic memory, as recited in claim 6, wherein said first, second and third transistors are provided by a single integrated circuit semiconductor transistor structure, said single integrated circuit semiconductor transistor structure having a collector region for providing in common the collectors of said first, second and third transistors, a first base region for providing the base of said first transistor, a second base region for providing in common the base of said second and third transistors, and first, second and third emitters for respectively providing said emitters of said first, second and third transistors.

8. In an integrated circuit chip containing interconnected logic circuit means and at least one monolithic memory, as recited in claim 7, wherein a first Schottky diode is connected across said collector-base junction of said first transistor, a second Schottky diode is connected across said common collector-base junction of said second and third transistors, a third Schottky diode is connected across said collector base junction of said fourth transistor and a fourth Schottky diode is connected across said collector-base junction of said fifth transistor.

9. In an integrated circuit chip containing interconnected logic circuit means and at least one monolithic memory, as recited in claim 6, wherein said control circuit means comprises:
n pairs of NAND circuits, each pair of NAND circuits having a first NAND circuit and a second NAND circuit, each said NAND circuit having a first input, a second input and an output, said output of each of said first NAND circuits of said n pairs of NAND circuits being connected each to a discrete word read line of said n pairs of word lines, and said output of each of said second NAND circuits of said n pairs of NAND circuits being connected each to a discrete word write lines of said n pairs of word lines;
address decoder circuit means, said address decoder circuit means having an input for receiving an address of any one of said n binary words (or bytes) stored, or to be stored in said m×n memory array, said address decoder circuit means also having n output lines, each of said n output lines being connected in common to the second input of said first NAND circuit and to the first input of said second NAND circuit of a discrete one of n pairs of NAND circuits;
a read signal control source connected in common to said first input of each first NAND circuit of each of said n pairs of NAND circuits; and
a write signal control source connected in common to said second input of each second NAND circuit of each of said n pairs of NAND circuits.

10. In an integrated circuit chip containing interconnected logic circuit means and at least one monolithic memory, as recited in claim 9, wherein said data-out circuit means connected to said m data-out bit lines of said m pairs of bit lines comprises:
connection means for respectively connecting said m data-out bit lines to a source of potential V; and
m transistors, each of said m transistors having a collector, base and emitter, each of said bases of said m transistors being connected to a discrete one of said m data-out lines, each of said collectors of said m transistors being connected to said source of potential V, and each of said emitters of said m transistors being connected to a reference potential G; and
m data-out output terminals respectively connected to the collectors of said m transistors.

11. In an integrated circuit chip containing interconnected logic circuit means and at least one monolithic memory, as recited in claim 6, wherein said control circuit means comprises:
n pairs of NAND circuits, each pair of NAND circuits having a first NAND circuit and a second NAND circuit, each of said NAND circuits having a first input, a second input and an output, said output of each of said first NAND circuits of said n pairs of NAND circuits being connected each to a discrete word read line of said n pairs of word lines and said output of each of said second NAND circuits of said n pairs of NAND circuits being connected each to a discrete word write line of said n pairs of word lines;
read address decoder circuit means, said read address decoder circuit means having an input for receiving the read address of any one of said n binary words (or bytes) stored in said m×n memory array, said read address decoder circuit means also having n output lines, each of said n output lines of said read address decoder circuit means being connected to the first input of said first NAND circuit of a discrete one of said n pairs of NAND circuits;
write address decoder circuit means, said write address decoder circuit means having an input for receiving the write address of any one of said n binary words (or bytes) to be stored in said m×n memory array, said write address decoder circuit means also having n output lines, each of said n output lines of said write address decoder circuit means being connected to the first input of said second NAND circuit of a discrete one of said n pairs of NAND circuits;
a read signal source connected to said second input of each first NAND circuit of said n pairs of NAND circuits; and
a write signal source connected to said second input of each second NAND circuit of said n pairs of NAND circuits.

12. In an integrated circuit chip containing interconnected logic circuit means and at least one monolithic memory, as recited in claim 11, wherein said data-out circuit means connected to said m data-out bit lines of said m pairs of bit lines comprises:
connection means for respectively connecting said m data-out bit lines to a source of potential V;
m transistors, each of said m transistors having a collector, base and emitter, each of said bases of said m transistors being connected to a discrete one of said m data-out bit lines, each of said collectors of said m transistors being connected to said source of potential V, and each of said emitters of said m transistors being connected to a reference potential G; and
m data-out output terminals respectively connected to the collectors of said m transistors.

13. In an integrated circuit chip containing interconnected logic circuit means and at least one monolithic memory, as recited in claim 5, wherein said control circuit means comprises:
n pairs of NAND circuits, each pair of NAND circuits having a first NAND circuit and a second NAND circuit, each said NAND circuit having a first input, a second input and an output, said output of each of said first NAND circuits of said n pairs of NAND circuits being connected each to a discrete word read line of said n pairs of word lines, and said output of each of said second NAND circuits of said n pairs of NAND circuits being connected each to a discrete word write line of said n pairs of word lines;
address decoder circuit means, said address decoder circuit means having an input for receiving an address of any one of said n binary words (or bytes) stored, or to be stored in said m×n memory array, said address decoder circuit means also having n output lines, each of said n output lines being connected in common to the second input of said first NAND circuit and to the first input of said second NAND circuit of a discrete one of n pairs of NAND circuits;

a read signal control source connected in common to said first input of each first NAND circuit of each of said n pairs of NAND circuits; and a write signal control source connected in common to said second input of each second NAND circuit of each of said n pairs of NAND circuits.

14. In an integrated circuit chip containing interconnected logic circuit means and at least one monolithic memory, as recited in claim 13, wherein said data-out circuit means connected to said m data-out bit lines of said m pairs of bit lines comprises:

connection means for respectively connecting said m data-out bit lines to a source of potential V; and m transistors, each of said m transistors having a collector, base and emitter, each of said bases of said m transistors being connected to a discrete one of said m data-out lines, each of said collectors of said m transistors being connected to said source of potential V, and each of said emitters of said m transistors being connected to a reference potential G; and m data-out output terminals respectively connected to the collectors of said m transistors.

15. In an integrated circuit chip containing interconnected logic circuit means and at least one monolithic memory, as recited in claim 5, wherein said control circuit means comprises:

n pairs of NAND circuits, each pair of NAND circuits having a first NAND circuit and a second NAND circuit, each of said NAND circuits having a first input, a second input and an output, said output of each of said first NAND circuits of said n pairs of NAND circuits being connected each to a discrete word read line of said n pairs of word lines and said output of each of said second NAND circuits of said n pairs of NAND circuits being connected each to a discrete word write line of said n pairs of word lines;

read address decoder circuit means, said read address decoder circuit means having an input for receiving the read address of any one of said n binary words (or bytes) stored in said m×n memory array, said read address decoder circuit means also having n output lines, each of said n output lines of said read address decoder circuit means being connected to the first input of said first NAND circuit of a discrete one of said n pairs of NAND circuits;

write address decoder circuit means, said write address decoder circuit means having an input for receiving the write address of any one of said n binary words (or bytes) to be stored in said m×n memory array, said write address decoder circuit means also having n output lines, each of said n output lines of said write address decoder circuit means being connected to the first input of said second NAND circuit of a discrete one of said n pairs of NAND circuits;

a read signal source connected to said second input of each first NAND circuit of said n pairs of NAND circuits; and a write signal source connected to said second input of each second NAND circuit of said n pairs of NAND circuits.

16. In an integrated circuit chip containing interconnected logic circuit means and at least one monolithic memory, as recited in claim 15, wherein said data-out circuit means connected to said m data-out lines of said m pairs of bit lines comprises:

connection means for respectively connecting said m data-out bit lines to a source of potential V; and m transistors, each of said m transistors having a collector, base and emitter, each of said bases of said m transistors being connected to a discrete one of said m data-out lines, each of said collectors of said m transistors being connected to said source of potential V, and each of said emitters of said m transistors being connected to a reference potential G; and m data-out output terminals respectively connected to the collectors of said m transistors.

17. In an integrated circuit chip containing p thousand of identical cells, where p is an integer equal to or greater than five, each of said cells containing components such as transistors, resistors and diodes and the like, at least a majority of said cells being fabricated into interconnected logic circuit means and memory array circuit means, said logic circuit means including:

at least one TTL logic circuit having at least one input and an output, at least one TTL logic circuit having at least two inputs and an output, and, at least one TTL logic circuit having at least three inputs and an output; and, said memory array circuit means including:

word read circuit means having at least one word read line, word write circuit means having at least one word write line, data in circuit means having at least one data in bit line, data out circuit means having at least one data out bit line; and at least one memory cell circuit, said memory cell circuit comprising, first, second, third, fourth and fifth transistors, each of said transistors having an emitter, base and collector, said emitters of said first and second transistors being connected in common to said data in bit line, said emitter of said third transistor being connected to said word write line, said collector of said fifth transistor being connected to said data out bit line and said emitter of said fourth transistor being connected to a second source of potential, a first resistor connected between said base of said first transistor and said word write line, a second resistor connected between a common connection of said collector of said first transistor, said collector of said second transistor, said collector of said third transistor and said base of said fourth transistor and a first source of potential, a third resistor connected between a common connection of said base of said second transistor, said base of said third transistor, said collector of said fourth transistor and said emitter of said fifth transistor and said first source of potential, and a fourth resistor connected between said base of said fifth transistor and said word read line;

said integrated circuit chip being further characterized in that said at least one TTL logic circuit having at least one input and an output, said at least one TTL logic circuit having at least two inputs and an output, said at least one TTL logic circuit having at least three inputs and an output, and said at least one memory cell circuit are respectively fabricated from the components contained within a single one of p thousand identical cells.

18. In an integrated circuit chip containing p thousand of identical cells, where p is an integer equal to or greater than five, each of said cells containing components, such as transistors, resistors and diodes and the like, at least a majority of said cells being fabricated into interconnected logic circuit means and memory array circuit means, as recited in claim 17, wherein said first, second and third transistors are provided by a single integrated circuit semiconductor transistor structure, said single integrated circuit semiconductor transistor structure having a collector region for providing in common the collectors of said first, second and third transistors, a first base region for providing the base of said first transistor, a second base region for providing in common the base of said second and third transistors, and first, second and third emitters for respectively providing said emitters of said first, second and third transistors.

19. In an integrated circuit chip containing p thousand of identical cells, where p is an integer equal to, or greater than five, each of said cells containing components, such as transistors, resistors and diodes and the like, at least a majority of said cells being fabricated into interconnected logic circuit means and memory array circuit means, as recited in claim 14, wherein a first Schottky diode is connected across said collector-base junction of said first transistor, a second Schottky diode is connected across said common collector-base junction of said second and third transistors, a third Schottky diode is connected across said collector base junction of said fourth transistor and a fourth Schottky diode is connected across said collector-base function of said fifth transistor.

20. In an integrated circuit chip containing logical circuit means for performing at least one logical function and at least one monolithic memory for storing binary data, said logical circuit means and said at least one monolithic memory being interconnected, said memory comprising:

an array of memory cells having m columns and n rows, where m and n are positive integers and said memory array includes m×n memory cells, where each of said cells has the capacity to store one binary data bit and each of said n rows of memory cells has the capacity to store a binary word (or byte) of m binary bits;

m pairs of bit lines, each pair of bit lines comprising a data-in bit line and a data-out bit-line;

n pairs of word lines, each pair of word lines comprising a word read line and a word write-line;

each of said m columns of memory cells being connected between the data-in bit line and the data-out bit line of a discrete one of said m pairs of bit lines;

each of said n rows of memory cells being connected between the word read line and the word write line of a discrete one of said n pairs of word lines;

data-in circuit means connected to said m data-in bit lines of said m pairs of bit lines;

data-out circuit means connected to said m data-out bit lines of said m pairs of bit lines;

n pairs of NAND circuits, each pair of NAND circuits having a first NAND circuit and a second NAND circuit, each of said first and second NAND circuits having a first input, a second input and an output, said output of each of said first NAND circuits of said n pairs of NAND circuits being connected each to a discrete word read line of said n pairs of word lines, and said output of each of said second NAND circuits of said n pairs of NAND circuits being connected each to a discrete word write line of said n pairs of word lines;

read address decoder circuit means, said read address decoder circuit means having an input for receiving an address of any predetermined one of said n binary words (or bytes) stored in said m×n memory array, said read address decoder circuit means also having n output lines, each of said n output lines of said read address decoder circuit means being connected to the first input of said first NAND circuit of a discrete one of n pairs of NAND circuits;

write address decoder circuit means, said write address decoder circuit means having an input for receiving an address of any predetermined one of said n binary words (or bytes) to be stored in said m×n memory array, said write address decoder circuit means also having n output lines, each of said n output lines of said write address decoder circuit means being connected to the first input of said second NAND circuit of a discrete one of said n pairs of NAND circuits;

a read signal control source connected in common to said second input of each first NAND circuit of each of said n pairs of NAND circuits; and a write signal control source connected in common to said second input of each second NAND circuit of each of said n pairs of NAND circuits.

21. In an integrated circuit chip containing interconnected logic circuit means and at least one monolithic memory, as recited in claim 20, wherein said data-out circuit means connected to said m data-out bit lines of said m pairs of bit lines comprises:

connection means for respectively connecting said m data-out bit lines to a source of potential V;

m transistors, each of said m transistors having a collector, base and emitter, each of said bases of said m transistors being connected to a discrete one of said m data-out lines, each of said collectors of said m transistors being connected to said source of potential V, and each of said emitters of said m transistors being connected to a reference potential G; and m data-out output terminals respectively connected to the collectors of said m transistors.

* * * * *